United States Patent
Kim

(10) Patent No.: US 7,692,248 B2
(45) Date of Patent: Apr. 6, 2010

(54) SEMICONDUCTOR DEVICE AND METHOD OF FABRICATING THE SAME

(75) Inventor: Chang Nam Kim, Seoul (KR)

(73) Assignee: Dongbu Electronics Co., Ltd., Seoul (KR)

( * ) Notice: Subject to any disclaimer, the term of this patent is extended or adjusted under 35 U.S.C. 154(b) by 433 days.

(21) Appl. No.: 11/639,157

(22) Filed: Dec. 15, 2006

(65) Prior Publication Data
US 2007/0158694 A1    Jul. 12, 2007

(30) Foreign Application Priority Data
Dec. 29, 2005   (KR)   ............ 10-2005-0133887

(51) Int. Cl.
*H01L 23/62* (2006.01)
(52) U.S. Cl. .......... 257/367; 257/365; 257/366; 257/E27.065
(58) Field of Classification Search .......... 257/288, 257/365–369, E27.065, E27.066; 438/218–220, 438/223, 224, 227
See application file for complete search history.

(56) References Cited

U.S. PATENT DOCUMENTS

| | | | |
|---|---|---|---|
| 5,910,677 A | 6/1999 | Irino | |
| 6,083,783 A * | 7/2000 | Lin et al. | 438/199 |
| 6,118,158 A | 9/2000 | Kim | |
| 6,713,820 B2 * | 3/2004 | Omi et al. | 257/382 |

FOREIGN PATENT DOCUMENTS

JP    2002-110974    4/2002

OTHER PUBLICATIONS

Office Action dated Dec. 12, 2008, for Chinese application No. 200610172013.2.
Office Action for Chinese patent app. 200610172013.2.
Office Action dated May 8, 2009, for Chinese application No. 200610172013.2.

* cited by examiner

*Primary Examiner*—Zandra Smith
*Assistant Examiner*—Paul E Patton
(74) *Attorney, Agent, or Firm*—Lowe Hauptman Ham & Berner, LLP

(57) ABSTRACT

A semiconductor device comprising a substrate having a well region, at least one well pickup region formed on the substrate to surround the well pickup region, a first drain region formed on the substrate to be positioned on one side of the source region, and a first gate electrode formed on the substrate to be positioned between the source region and the first drain region.

6 Claims, 4 Drawing Sheets

SEMICONDUCTOR DEVICE AND METHOD OF FABRICATING THE SAME

FIELD OF THE INVENTION

The present invention relates to a semiconductor device, and more particularly, to a semiconductor device capable of having a reduced well region footprint or overall device size and a method of fabricating the same.

BACKGROUND OF THE INVENTION

In general, a memory device is divided into a p-type transistor and an n-type transistor. Further, memory devices usually comprise poles, commonly referred to as: a source region, a drain region, a gate electrode, and a substrate.

Among the four poles, the substrate includes a structure that is commonly called a well. Wells are generally characterized by a lower concentration of impurities than that of the source and drain regions, e.g., by about 1/10000 or 1/100000. In addition, substrates generally have two types of wells, namely, an n-type well and a p-type well.

Wells are located in a well-region. Within the well region, a well pickup region is formed to stabilize the potential of the well region.

FIG. 1 illustrates a conventional semiconductor device, having a substrate 100 and a well region 105. Well region 105 further comprises a first drain region 102a, a source region 103, and a second drain region 102b; a first gate electrode 101a positioned between the first drain region 102a and the source region 103; a second gate electrode 101b positioned between the second drain region 102b and the source region 103. First gate electrode 101a and second gate electrode 101b are connected via a gate electrode connector 101c. Well region 105 also typically comprises a well pickup region 104.

The first and second gate electrodes 101a and 101b, the source region 103, the first and second drain regions 102a and 102b, and the well pickup region 104 are electrically connected to external wiring lines (not shown), respectively, through contact metals 111, 113, 112a, 112b, and 114.

In the conventional semiconductor device, the well pickup region 104 is formed at the edge of the substrate 100, which results in an increase of the size of the device.

SUMMARY OF THE INVENTION

In accordance with one embodiment of the present invention, there is provided a semiconductor device, comprising:
a substrate having a well region;
at least one well pickup region formed on the well region;
a source region formed on the substrate to surround the well pickup region;
a first drain region formed on the substrate to be positioned on one side of the source region; and
a first gate electrode formed on the substrate to be positioned between the source region and the first drain region.

In another embodiment of the present invention, there is provided a method of manufacturing a semiconductor device, comprising:
forming a well region on a substrate;
forming at least one well pickup region on the well region;
forming a source region on the substrate to surround the well pickup region;
forming a first drain region on the substrate to be positioned on one side of the source region; and
forming a first gate electrode on the substrate to be positioned between the source region and the first drain region.

It is an object of the present invention to provide a semiconductor device in which a well pickup region is formed in a source region to reduce the size of the device.

BRIEF DESCRIPTION OF THE DRAWINGS

Various objects and features of the present invention will become apparent from the following detailed description of the preferred embodiments given in conjunction with the accompanying drawings, in which.

DETAILED DESCRIPTION OF THE PREFERRED EMBODIMENTS

Figure 1:
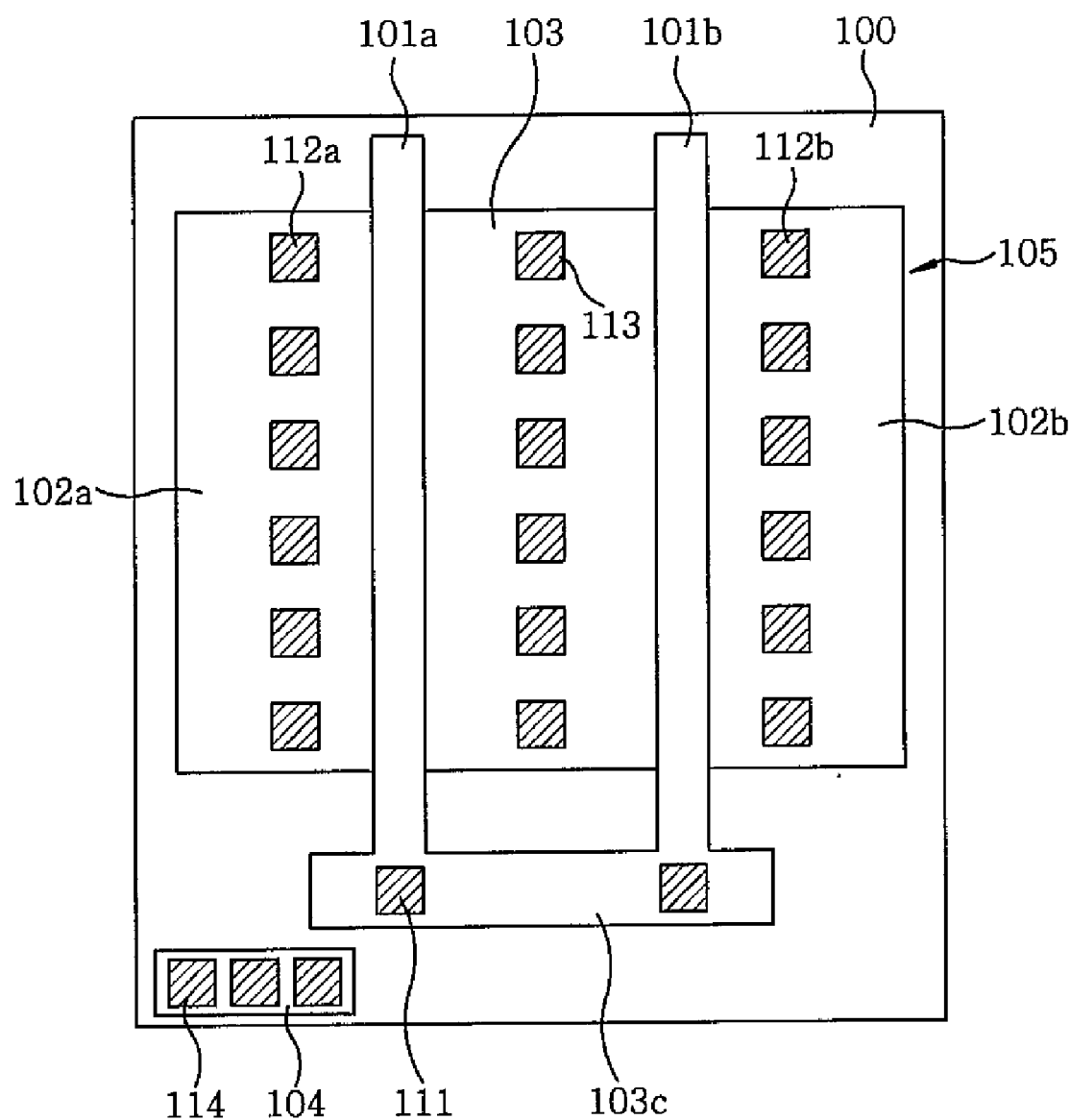
FIG. 1 illustrates a conventional semiconductor device.
Figure 2:
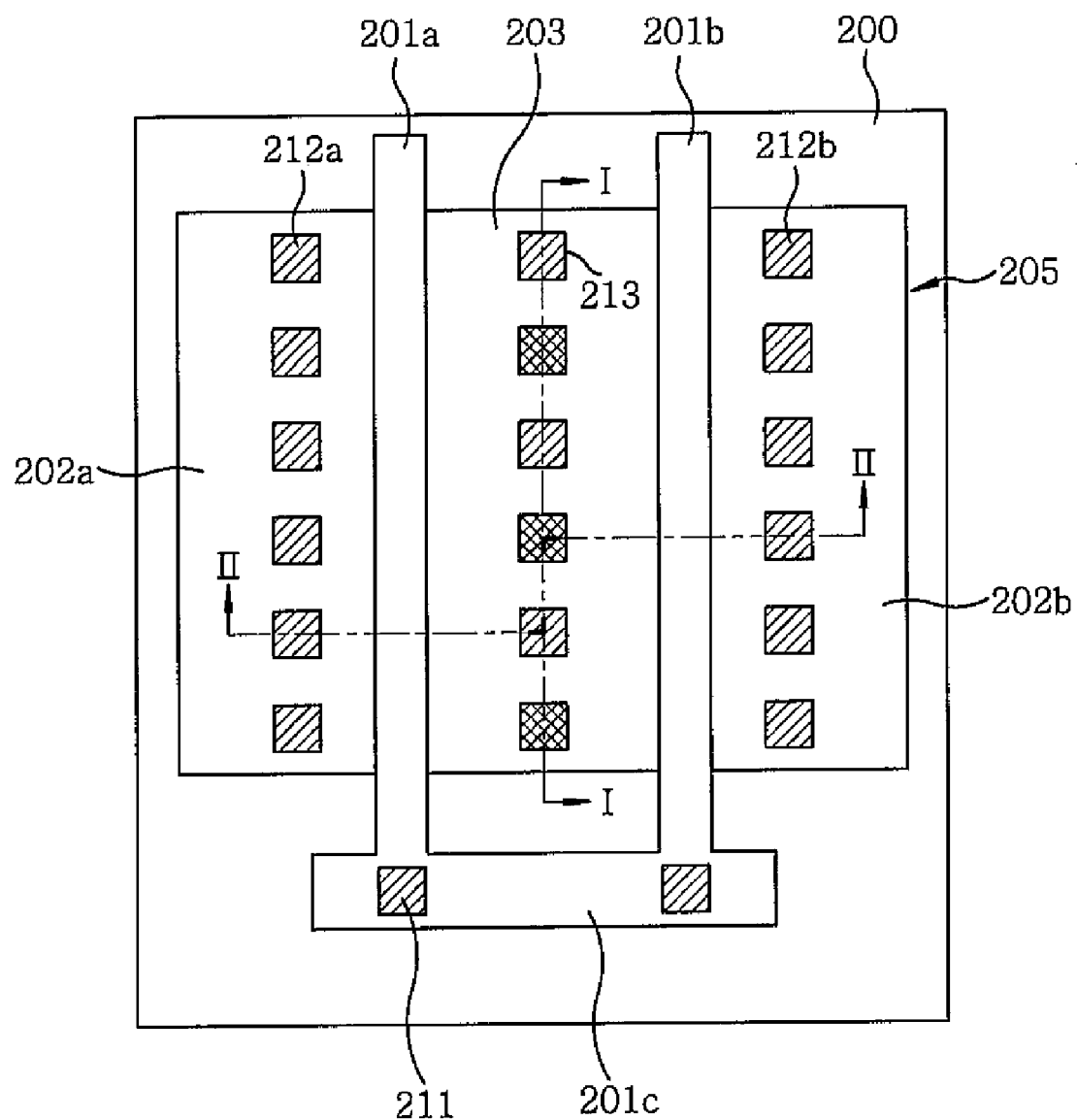
FIG. 2 illustrates a semiconductor device according to one embodiment of the present invention.
Figure 3:
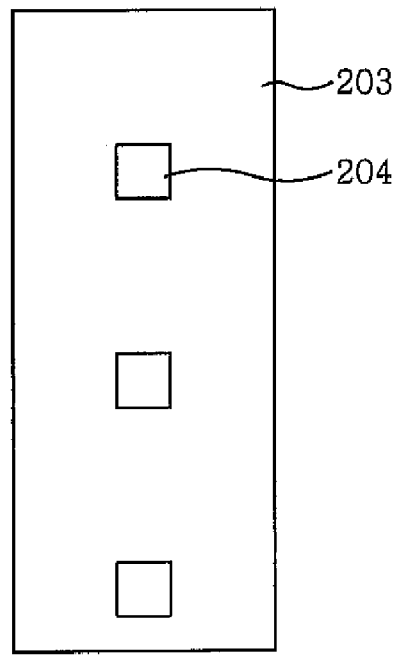
FIG. 3 illustrates the source region and the well pickup region of FIG. 2.

FIG. 2 shows one embodiment for a semiconductor device in accordance with the teachings of the present invention, comprising a substrate 200 having a well region 205. Well region 205 further comprises: a first drain region 202a, a source region 203, a second drain region 202b; a first gate electrode 201a (preferably positioned between the first drain region 202a and the source region 203); a second gate electrode 201b (preferably positioned between the second drain region 202b and the source region 203), a gate electrode connector 201c (connecting first gate electrode 201a and second gate electrode 201b). FIG. 3 further shows that source region 203 includes one or more well pickup regions 204.

As illustrated in FIG. 3, the source region 203 has a plurality of hole regions that partially expose the well region 205 (shown in FIG. 2) of substrate 200 and well pickup regions 204 are formed in the hole regions. Well pickup regions 204 may preferably be arranged in a longitudinal direction of the first and second gate electrodes 201a and 201b.

As described above, a semiconductor incorporating the principles and teachings illustrated in FIGS. 2 and 3 may have a reduced well region size, in that, the well pickup regions 204 are formed in the source region 203.

In another embodiment of the present invention, well region 205 and well pickup regions 204 are doped to be n-type, while source region 203, first drain region 202a, and second drain region 202b are doped to be p-type. It should be understood that the well region 205 and well pickup regions 204 may be doped to be p-type, while the source region 203, first drain region 202a, and second drain region 202b may be doped to be n-type.

Figure 4:
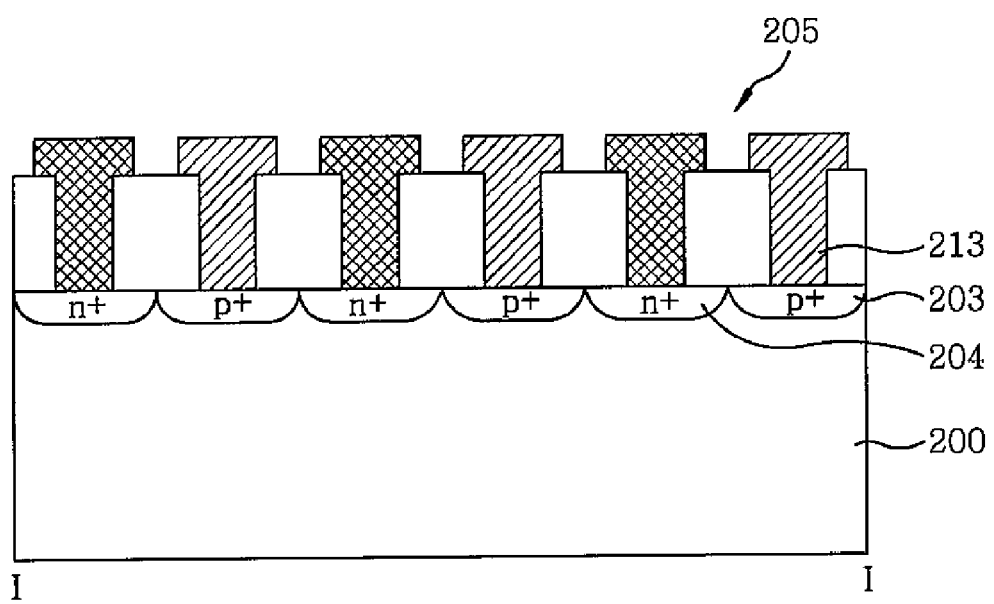
FIG. 4 is a sectional view taken along the line I-I of FIG. 2.

FIG. 4 is a sectional view taken along the line I-I of FIG. 2. As illustrated in FIG. 4, a protective layer is formed on an entire surface of substrate 200 including the first and second gate electrodes 201a and 201b, source region 203, first and second drain regions 202a and 202b, the well region (not entirely shown), and well pick up regions 204. Formed in the protective layer is a plurality of contact holes that expose first and second gate electrodes 201a and 201b, source region 203, first and second drain regions 202a and 202b, the well region, and well pickup regions 204.

Referring back to FIG. 2, a first contact metal 211 is connected to the first and second gate electrodes 201a and 201b via connector 201c, a second contact metal 213 is connected to the source region 203, a third contact metal 212a is connected to the first drain region 202a, and a fourth contact metal 212b is connected to the second drain region 202b. As illustrated in FIG. 4, the contact metals are able to connect through he protective layer via the contact holes.

Figure 5:
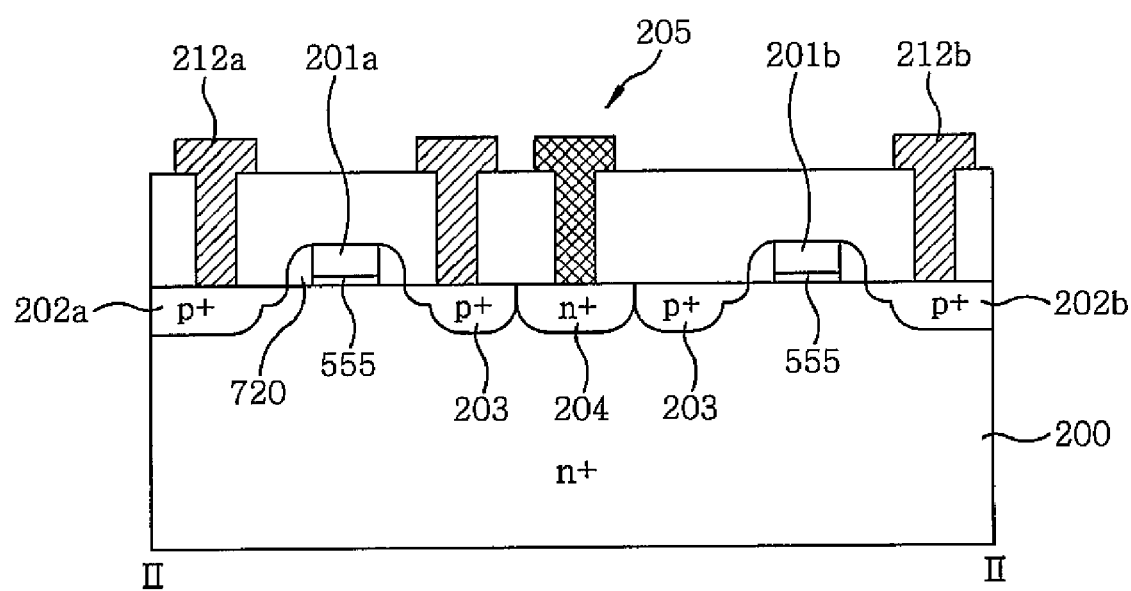
FIG. 5 is a sectional view taken along the line II-II of FIG. 2.

FIG. 5 is a sectional view taken along the line II-II of FIG. 2. As illustrated in FIG. 5, a gate insulating layer 555 is formed between the first gate electrode 201a and substrate 200. Spacers 720 are preferably formed on one or more sides of the first gate electrode 210a including the gate insulating layer 555. The gate insulating layer 555 is preferably formed between the second gate electrode 201b and substrate 200; and the spacers 720 are preferably formed on both sides of the second gate electrode 201b including the gate insulating layer 555.

Alternatively, well pickup regions 204 may be formed in the first drain region 202a (or the second drain region 202b). Also, well pick-up regions 204 may be divisionally formed in the source region 203, first drain region 202a, and second drain region 202b.

As described above, the semiconductor device according to the teachings herein may have a reduced size due to the formation of the well pickup regions in the source region.

While the invention has been shown and described with respect to the preferred embodiment, it will be understood by those skilled in the art that various changes and modifications may be made without departing from the spirit and scope of the invention as defined in the following claims.

What is claimed is:

1. A semiconductor device, comprising:
   a substrate having a well region;
   a source region located within the well region;
   one or more well pickup regions located within the source region;
   a first drain region positioned on one or more sides of the source region; and
   a first gate electrode positioned between the source region and the first drain region,
   wherein said one or more well pickup regions are located on an uppermost surface of the source region, and
   wherein the well pickup regions are configured to be confined within the source region.

2. The semiconductor device of claim 1, further comprising:
   a second drain region positioned on one or more sides of the source region; and
   a second gate electrode positioned in the source region and the second drain region,
   wherein the second gate electrode is connected to the first gate electrode.

3. The semiconductor device of claim 1, wherein the well pickup regions are arranged in the longitudinal direction of the first gate electrode.

4. A method of manufacturing a semiconductor device, comprising:
   forming a well region on a substrate;
   forming a source region located within the well region;
   forming one or more well pickup regions located within the source region;
   forming a first drain region on the substrate to be positioned on one or more sides of the source region; and
   forming a first gate electrode positioned between the source region and the first drain region,
   wherein said one or more well pickup regions are located on an uppermost surface of the source region, and
   wherein each of the well pickup regions is formed to be confined with the source region.

5. The method of claim 4, further comprising:
   forming a second drain region positioned on one or more sides of the source region; and
   forming a second gate electrode positioned in the source region and the second drain region,
   wherein the second gate electrode is connected to the first gate electrode.

6. The method of claim 4, wherein each of the well pickup regions are arranged in the longitudinal direction of the first gate electrode.

* * * * *